(12) United States Patent
Chang et al.

(10) Patent No.: US 10,355,185 B2
(45) Date of Patent: Jul. 16, 2019

(54) LIGHT EMITTING DIODE ARRAY PACKAGE HAVING A PLURALITY OF POWER SOURCE SIGNALS WITHOUT LIMITING RESISTOR

(71) Applicant: HARVATEK CORPORATION, Hsinchu (TW)

(72) Inventors: Jen-Hung Chang, Hsinchu (TW); Song-Yi Hsiao, Hsinchu (TW)

(73) Assignee: Harvatek Corporation, Hsinchu (TW)

( * ) Notice: Subject to any disclaimer, the term of this patent is extended or adjusted under 35 U.S.C. 154(b) by 0 days.

(21) Appl. No.: 15/855,727

(22) Filed: Dec. 27, 2017

(65) Prior Publication Data

US 2019/0088841 A1    Mar. 21, 2019

(30) Foreign Application Priority Data

Sep. 20, 2017 (TW) .............................. 106132202 A

(51) Int. Cl.
*H01L 33/00* (2010.01)
*H01L 33/62* (2010.01)
(Continued)

(52) U.S. Cl.
CPC ............. *H01L 33/62* (2013.01); *H01H 9/181* (2013.01); *H01L 27/153* (2013.01);
(Continued)

(58) Field of Classification Search
CPC ...... H01L 33/62; H01L 27/153; H01L 27/156; H01H 9/181; H04N 1/0288
See application file for complete search history.

(56) References Cited

U.S. PATENT DOCUMENTS

| 2011/0210349 A1* | 9/2011 | Pan | ...................... H01L 25/0753 257/88 |
| 2012/0235574 A1* | 9/2012 | Sumi | .................. H05B 33/0887 315/131 |

FOREIGN PATENT DOCUMENTS

JP            04303884 A    * 10/1992

* cited by examiner

*Primary Examiner* — Ermias T Woldegeorgis
(74) *Attorney, Agent, or Firm* — Faegre Baker Daniels LLP

(57) ABSTRACT

An LED package includes N number of first pins, six second pins and N number of LED units, where N is four or six. Each of the LED units includes first to third LEDs, each of which has first and second terminals. The first terminal of the first LED for each of $(2j-1)^{th}$ and $(2j)^{th}$ LED units is connected to a $(2j-1)^{th}$ first pin. The first terminals of the second and third LEDs for each of the $(2j-1)^{th}$ and $(2j)^{th}$ LED units are connected to a $(2j)^{th}$ first pin, where j is an integer and $0 < j \leq N/2$. The second terminals of the first, second and third LEDs for the $(2j-1)^{th}$ LED unit are connected to the $1^{st}$, $2^{nd}$ and $3^{rd}$ second pins, respectively. The second terminals of the first, second and third LEDs for the $(2j)^{th}$ LED unit are connected to the $4^{th}$, $5^{th}$ and $6^{th}$ second pins.

7 Claims, 3 Drawing Sheets

(51) Int. Cl.
*H01L 33/30* (2010.01)
*H01L 33/32* (2010.01)
*H01L 27/15* (2006.01)
*H01H 9/18* (2006.01)
*H04N 1/028* (2006.01)

(52) U.S. Cl.
CPC ............ *H01L 27/156* (2013.01); *H01L 33/30* (2013.01); *H01L 33/32* (2013.01); *H04N 1/0288* (2013.01)

LIGHT EMITTING DIODE ARRAY PACKAGE HAVING A PLURALITY OF POWER SOURCE SIGNALS WITHOUT LIMITING RESISTOR

CROSS-REFERENCE TO RELATED APPLICATION

This application claims priority of Taiwanese Invention Patent Application No. 106132202, filed on Sep. 20, 2017, the entire disclosure of which is hereby expressly incorporated by reference herein.

FIELD

The disclosure relates to a semiconductor package, and more particularly to a light emitting diode (LED) package.

BACKGROUND

Referring to FIG. 1, a conventional light emitting diode (LED) module 1 is configured to receive a power source signal Vcc, and includes a plurality of LED packages 11 and a plurality of limiting resistors 110 corresponding respectively to the LED packages 11. Each of the LED packages 11 includes a first LED 111, which is connected in series with the respective one of the limiting resistors 110, a second LED 112 and a third LED 113. In each of the LED packages 11, the first, second and third LEDs 111, 112 and 113 respectively have anodes that are electrically connected with each other for receiving the power source signal Vcc, and are activated by the power source signal Vcc to emit red light, green light and blue light, respectively.

For each of the LED packages 11, since the first LED 111 is made of a material different from that of the second and third LEDs 112 and 113, which are made of a same material, a forward voltage of the first LED 111 during light emission (around 2 volts) would be different from a forward voltage of each of the second and third LEDs 112 and 113 (around 3 volts). Therefore, in order to mitigate the issue of electric leakage in the first LEDs 111 or the issue that the first LEDs 111 may burn out due to an excessive driving voltage during light emission, for each of the LED packages 11 in the conventional LED module 1, the limiting resistor 110 is necessary for reducing the voltage across the first LED 111.

However, the inclusion of the limiting resistors 110 may cause relatively high energy consumption which will lead to heat accumulation in the conventional LED module 1. As a result, the materials of the first, second third LEDs 111, 112 and 113 may deteriorate in the long term, and efficiency of light emission for each of the LED packages 11 may thus diminish. To make matters worse, the LED packages 11 may even fail to function. The incorporation of the limiting resistors 110 also induces more complicated circuit architecture and higher manufacturing cost.

SUMMARY

Therefore, an object of the disclosure is to provide an LED package that can alleviate at least one of the drawbacks of the prior art.

According to the disclosure, the LED package includes N number of first pins, six second pins, N number of LED units, and a substrate for dispositions of the N number of first pins, the six second pins and the N number of LED units thereon.

The first pins are configured to receive N number of power source signals, respectively, where N is one of four and six.

Each of the LED units includes a first LED, a second LED and a third LED. Each of the first LED, the second LED and the third LED has a first terminal and a second terminal. The first terminal of the first LED for each one of a $(2j-1)^{th}$ one of the LED units and a $(2j)^{th}$ one of the LED units is electrically connected to a $(2j-1)^{th}$ one of the first pins. The first terminals of the second LED and the third LED for each one of the $(2j-1)^{th}$ one of the LED units and the $(2j)^{th}$ one of the LED units are electrically connected to a $(2j)^{th}$ one of the first pins, where j is an integer greater than zero, and is smaller than or equal to N/2.

The second terminals of the first LED, the second LED and the third LED for the $(2j-1)^{th}$ one of the LED units are electrically connected to a first one of the second pins, a second one of the second pins and a third one of the second pins, respectively, and the second terminals of the first LED, the second LED and the third LED for the $(2j)^{th}$ one of the LED units are electrically connected to a fourth one of the second pins, a fifth one of the second pins and a sixth one of the second pins, respectively.

An effect of the disclosure resides in that, by electrically connecting the first electrode of the first LED to one of the first pins, and by electrically connecting the first electrodes of the second LED and the third LED to another one of the first pins, an additional limiting resistor may be omitted.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
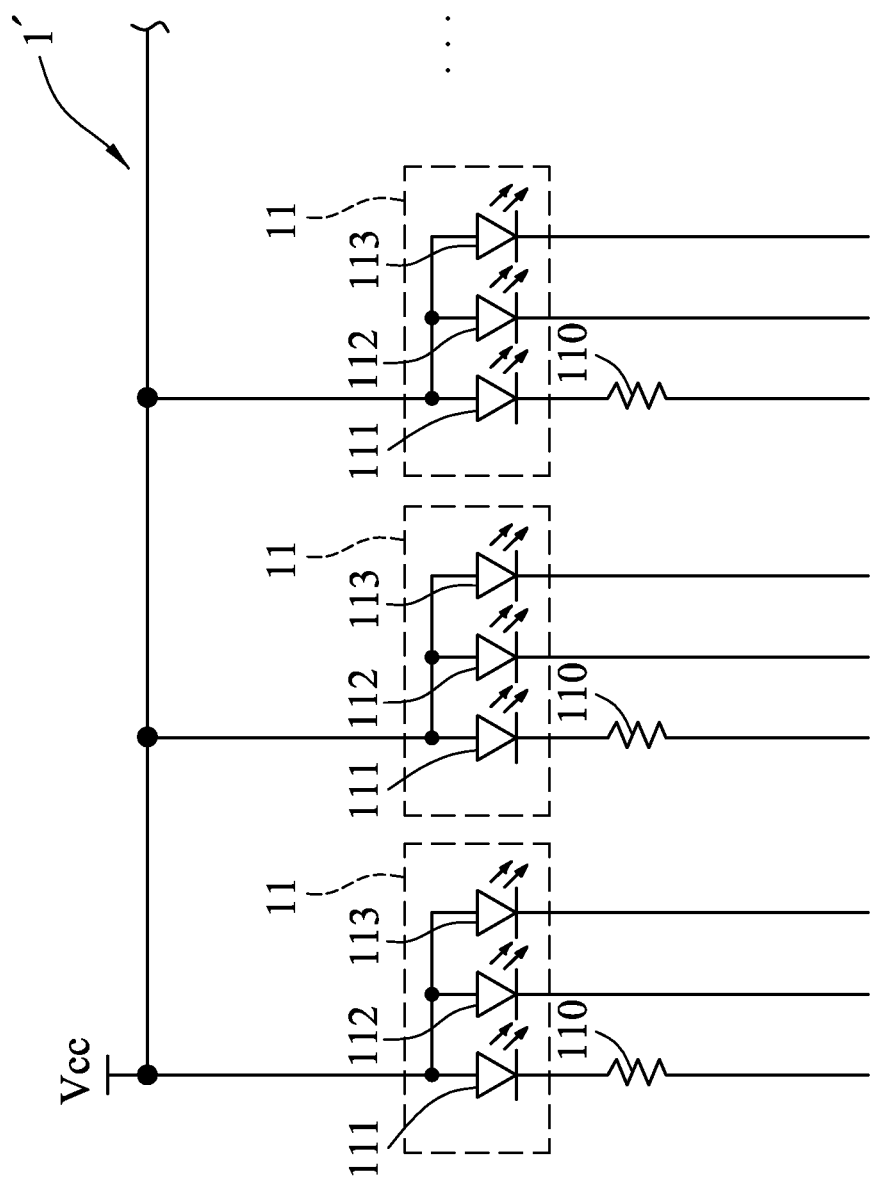
FIG. 1 is a circuit diagram illustrating a convention LED module.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
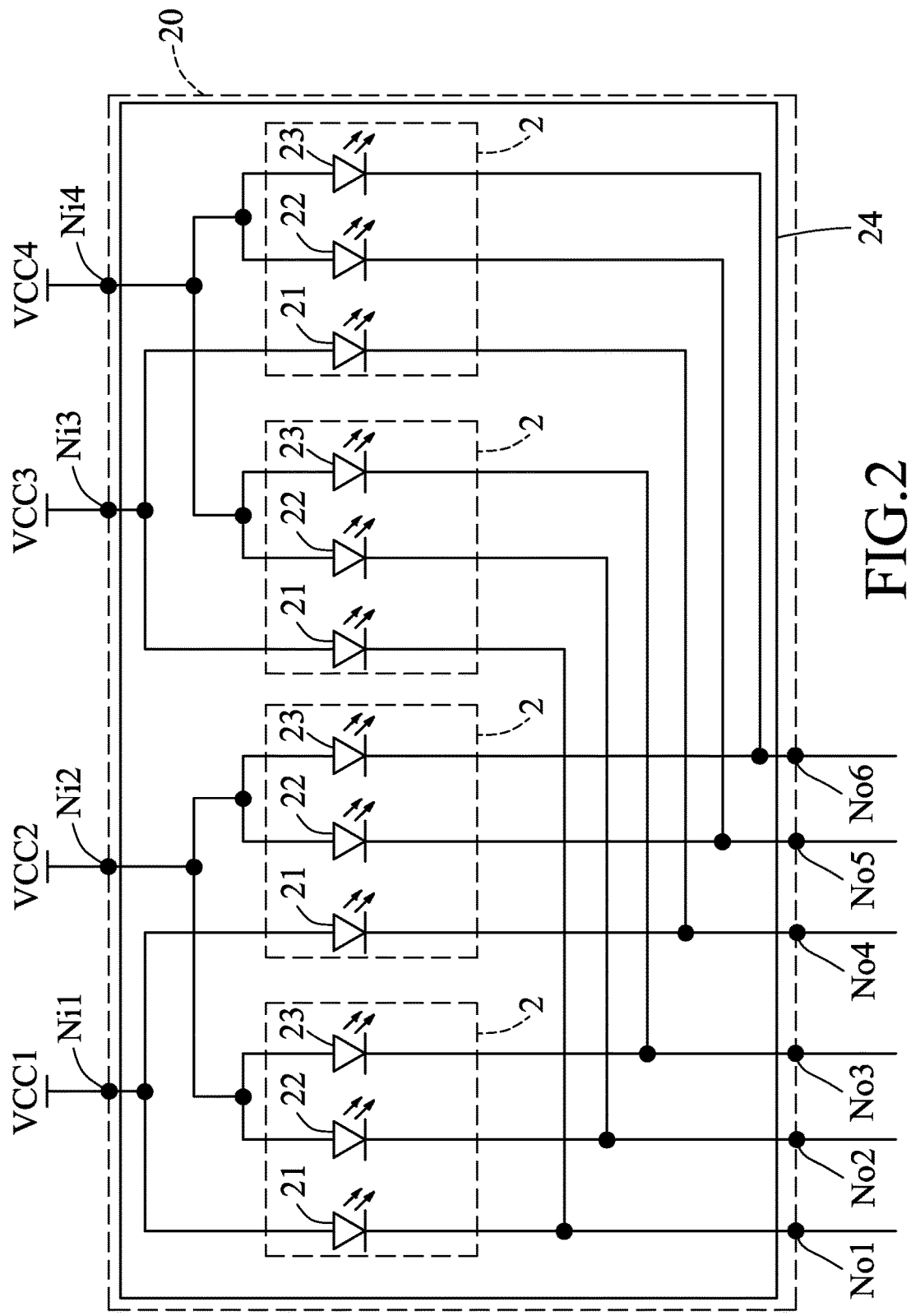
FIG. 2 is a circuit diagram illustrating one embodiment of an LED package according to the disclosure.

Referring to FIG. 2, a first embodiment of a light emitting diode (LED) package 20 according to the disclosure includes N number of first pins. In this embodiment, N is equal to four, and four first pins Ni1, Ni2, Ni3 and Ni4 are thus included in the LED package 20. The LED package 20 further includes six second pins No1, No2, No3, No4, No5 and No6, a substrate 24, and N number of LED units, that is, four LED units 2 in this embodiment. The four first pins Ni1-Ni4, the six second pins No1-No6, and the four LED units 2 are disposed on the substrate 24. The LED package 20 is a multi-pixel package. Each of the second pins No1-No6 serves as a respective one of external electrodes for the multi-pixel package, such as leads, contact pads or solder pads for the multi-pixel package. A plurality of the LED packages 20 may be combined to form an LED module or an LED display.

The first pins Ni1-Ni4 are configured to receive four power source signals VCC1, VCC2, VCC3 and VCC4, respectively. In this embodiment, the voltages of the power source signals VCC1 and VCC3 are smaller than the voltages of the power source signals VCC2 and VCC4. Each of the power source signals VCC1-VCC4 is provided by a respective one of constant-voltage power sources or by a respective one of constant-current power sources. The power source signals VCC1-VCC4 may have the same or different values, as independently controlled by the respective power sources.

Each of the LED units 2 includes a first LED 21, a second LED 22 and a third LED 23. Each of the first LED 21, the second LED 22 and the third LED 23 has a first terminal and a second terminal.

The first terminal of the first LED 21 for each one of a $(2j-1)^{th}$ one of the LED units 2 and a $(2j)^{th}$ one of the LED units 2 is electrically connected to a $(2j-1)^{th}$ one of the first pins Ni(2j−1), where j is an integer greater than zero, and is smaller than or equal to N/2. In this embodiment, since N is equal to four, j is thus equal to one or two. Moreover, the first terminals of the second LED 22 and the third LED 23 for each one of the $(2j-1)^{th}$ one of the LED units 2 and the $(2j)^{th}$ one of the LED units 2 are electrically connected to a $(2j)^{th}$ one of the first pins Ni(2j), where j is equal to one or two in this embodiment.

For example, in this embodiment, when j is equal to one, the first terminal of the first LED 21 for each one of the first one of the LED units 2 and the second one of the LED units 2 is electrically connected to the first one of the first pins Ni1. The first terminals of the second LED 22 and the third LED 23 for each one of the first one of the LED units 2 and the second one of the LED units 2 are electrically connected to the second one of the first pins Ni2.

On the other hand, the second terminals of the first LED 21, the second LED 22 and the third LED 23 for the $(2j-1)^{th}$ one of the LED units 2 are electrically connected to a first one of the second pins No1, a second one of the second pins No2 and a third one of the second pins No3, respectively. The second terminals of the first LED 21, the second LED 22 and the third LED 23 for the $(2j)^{th}$ one of the LED units 2 are electrically connected to a fourth one of the second pins No4, a fifth one of the second pins No5 and a sixth one of the second pins No6, respectively.

For example, the second terminals of the first LED 21, the second LED 22 and the third LED 23 for each of the first one of the LED units 2 and a third one of the LED units 2 are electrically connected to the first one of the second pins No1, the second one of the second pins No2 and the third one of the second pins No3, respectively. The second terminals of the first LED 21, the second LED 22 and the third LED 23 for each of the second one of the LED units 2 and a fourth one of the LED units 2 are electrically connected to the fourth one of the second pins No4, the fifth one of the second pins No5 and the sixth one of the second pins No6, respectively.

It should be noted that, for each of the LED units 2, the first terminal of each of the first LED 21, the second LED 22 and the third LED 23 is an anode, and the second terminal of each of the first LED 21, the second LED 22 and the third LED 23 is a cathode. For each of the LED units 2, the second LED 22 and the third LED 23 are made of indium gallium nitride (InGaN), and the first LED 21 is made of aluminium gallium indium phosphide (AlGaInP). Moreover, for each of the LED units 2, the first LED 21 emits red light, the second LED 22 emits green light, and the third LED 23 emits blue light.

Figure 3:
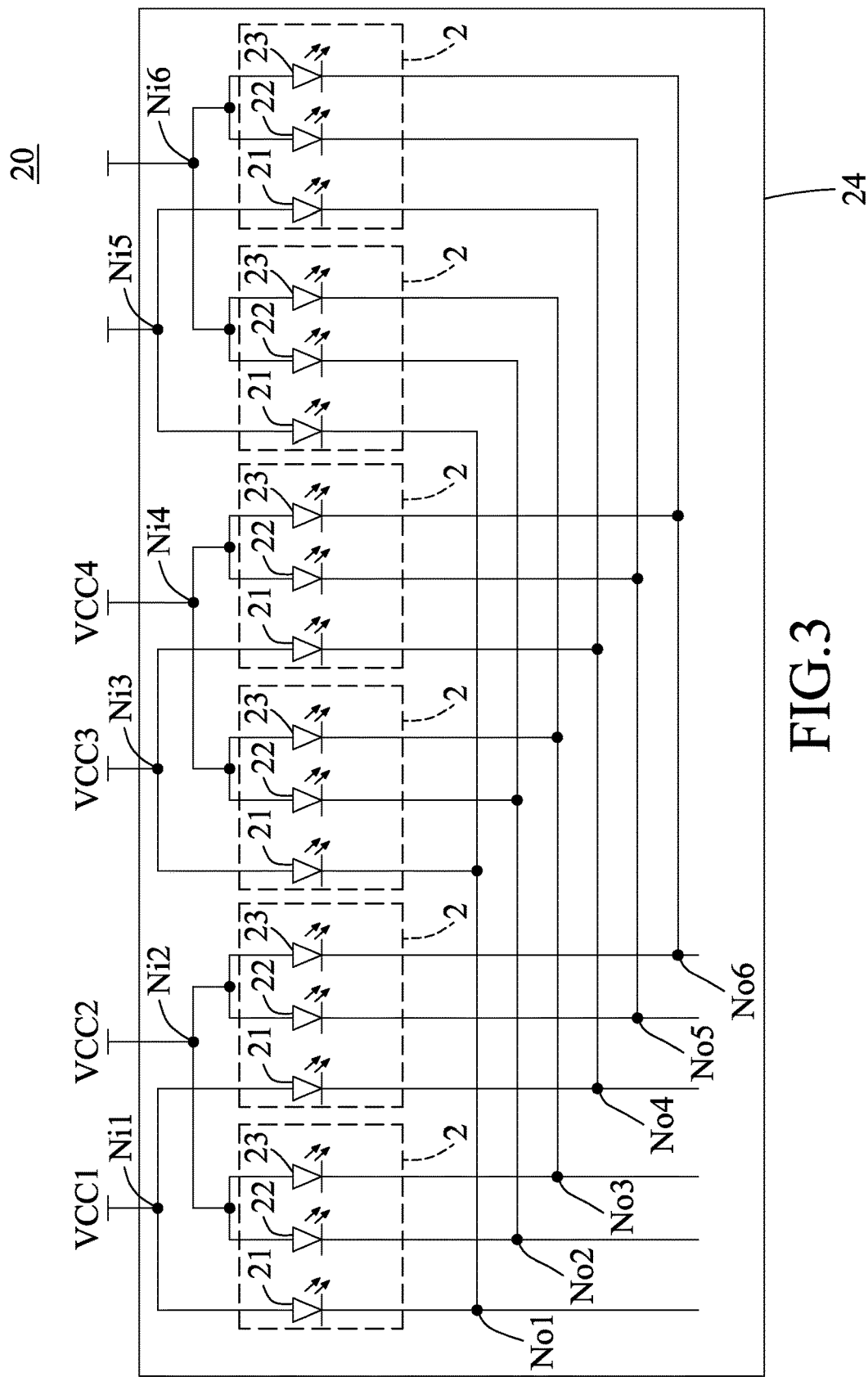
FIG. 3 is a circuit diagram illustrating another embodiment of the LED package according to the disclosure.

Referring to FIG. 3, a second embodiment of the LED package 20 according to the disclosure is illustrated which is similar to the first embodiment as shown in FIG. 2 and is different in that the LED package 20 of the second embodiment includes six first pins Ni1, Ni2, Ni3, Ni4, Ni5 and Ni6 configured to receive six power source signals VCC1, VCC2, VCC3, VCC4, VCC5 and VCC6, and six LED units 2. That is to say, N is equal to six, and j is equal to one, two or three. In addition, the second terminals of the first LED 21, the second LED 22 and the third LED 23 for each of a first one of the LED units 2, a third one of the LED units 2 and a fifth one of the LED units 2 are electrically connected to the first one of the second pins No1, the second one of the second pins No2 and the third one of the second pins No3, respectively. The second terminals of the first LED 21, the second LED 22 and the third LED 23 for each of a second one of the LED units 2, a fourth one of the LED units 2 and a sixth one of the LED units 2 are electrically connected to the fourth one of the second pins No4, the fifth one of the second pins No5 and the sixth one of the second pins No6, respectively.

To sum up, for each one of the LED units 2 in the LED package 20 of the disclosure, since the power source signal VCC1 (or VCC3 or VCC5) received by the first LED 21 is different from the power source signal VCC2 (or VCC4 or VCC6) received by the second LED 22 and the third LED 23, the first LED 21 is independently controlled with respect to the second LED 22 and the third LED 23, and is different from the first LED 111 of the LED package 11 as shown in FIG. 1 which is controlled together with the second LED 112 and the third LED 113 by an identical power source signal Vcc. Therefore, the limiting resistors 110 of the conventional LED module 1 which are introduced for mitigating the issue of electric leakage or burn-out due to excessive driving voltage applied to the first LEDs 111 may be omitted in the LED package 20 of this disclosure. In this way, an LED module constituted by at least one LED package 20 of the disclosure may consume less energy compared with the conventional LED module 1, so heat accumulation in the LED module may be reduced and reliability of the LED package 20 according to the disclosure may be promoted. Moreover, a simpler electric circuit architecture and a lower manufacturing cost may be achieved.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light emitting diode (LED) package comprising:
N number of first pins which are configured to receive N number of power source signals, respectively, where N is one of four and six;
six second pins;
N number of LED units each of which includes a first LED, a second LED and a third LED, each of said first LED, said second LED and said third LED having a first terminal and a second terminal, said first terminal of said first LED for each one of a $(2j-1)^{th}$ one of said LED units and a $(2j)^{th}$ one of said LED units being electrically connected to a $(2j-1)^{th}$ one of said first pins, said first terminals of said second LED and said third LED for each one of the $(2j-1)^{th}$ one of said LED units and the $(2j)^{th}$ one of said LED units being electrically connected to a $(2j)^{th}$ one of said first pins, where j is an integer greater than zero, and is smaller than or equal to N/2; and
a substrate for dispositions of said N number of first pins, said six second pins and said N number of LED units thereon;
wherein said second terminals of said first LED, said second LED and said third LED for the $(2j-1)^{th}$ one of said LED units are electrically connected to a first one of said second pins, a second one of said second pins and a third one of said second pins, respectively, and said second terminals of said first LED, said second LED and said third LED for the $(2j)^{th}$ one of said LED units are electrically connected to a fourth one of said second pins, a fifth one of said second pins and a sixth one of said second pins, respectively.

2. The LED package of claim 1, wherein for each of said LED units, said second LED and said third LED are made of an same material, and said first LED is made of a material different from that of said second LED and said third LED.

3. The LED package of claim 2, wherein for each of said LED units, said second LED and said third LED are made of indium gallium nitride (InGaN), and said first LED is made of aluminium gallium indium phosphide (AlGaInP).

4. The LED package of claim 1, wherein when N is equal to four, said second terminals of said first LED, said second LED and said third LED for each of a first one of said LED units and a third one of said LED units are electrically connected to the first one of said second pins, the second one of said second pins and the third one of said second pins, respectively, and said second terminals of said first LED, said second LED and said third LED for each of a second one of said LED units and a fourth one of said LED units are electrically connected to the fourth one of said second pins, the fifth one of said second pins and the sixth one of said second pins, respectively.

5. The LED package of claim 1, wherein when N is equal to six, said second terminals of said first LED, said second LED and said third LED for each of a first one of said LED units, a third one of said LED units and a fifth one of said LED units are electrically connected to the first one of said second pins, the second one of said second pins and the third one of said second pins, respectively, and said second terminals of said first LED, said second LED and said third LED for each of a second one of said LED units, a fourth one of said LED units and a sixth one of said LED units are electrically connected to the fourth one of said second pins, the fifth one of said second pins and the sixth one of said second pins, respectively.

6. The LED package of claim 1, wherein for each of said LED units, said first terminal of each of said first LED, said second LED and said third LED is an anode, and said second terminal of each of said first LED, said second LED and said third LED is a cathode.

7. The LED package of claim 1, wherein for each of said LED units, said first LED emits red light, said second LED emits green light, and said third LED emits blue light.

* * * * *